United States Patent [19]

Matsuzawa et al.

[11] Patent Number: 5,034,628
[45] Date of Patent: Jul. 23, 1991

[54] FAST TRAILING BIMOS LOGIC GATE

[75] Inventors: Akira Matsuzawa, Neyagawa; Haruyasu Yamada, Hirakata, both of Japan

[73] Assignee: Matsushita Electric Industrial Co., Ltd., Osaka, Japan

[21] Appl. No.: 350,250

[22] Filed: May 11, 1989

[30] Foreign Application Priority Data

May 16, 1988 [JP] Japan .................... 63-118519

[51] Int. Cl.⁵ .................................... H03K 19/01
[52] U.S. Cl. ..................... 307/446; 307/443; 307/570
[58] Field of Search ............... 307/443, 446, 448, 451, 307/362, 570

[56] References Cited

U.S. PATENT DOCUMENTS

| | | | |
|---|---|---|---|
| 3,541,353 | 11/1970 | Seelbach et al. | 307/446 |
| 4,682,054 | 7/1987 | McLaughlin | 307/570 X |
| 4,694,203 | 9/1987 | Uragami et al. | 307/446 |
| 4,740,718 | 4/1988 | Matsui | 307/443 X |
| 4,804,869 | 2/1989 | Masuda et al. | 307/446 |
| 4,816,705 | 3/1989 | Ohba et al. | 307/446 |
| 4,871,928 | 10/1989 | Bushey | 307/451 X |
| 4,880,998 | 11/1989 | Ueda | 307/446 |
| 4,948,994 | 8/1990 | Akioka et al. | 307/446 X |

OTHER PUBLICATIONS

"0.5 Micron BIMOS Technology", H. Momose et al., Hewlett-Packard Company, Palo Alto, Calif.

Primary Examiner—David Hudspeth
Attorney, Agent, or Firm—Stevens, Davis Miller & Mosher

[57] ABSTRACT

The invention relates to a BIMOS logic gate comprising: a bipolar transistor; and depletion type MOS transistors whose sources are connected to a base of the bipolar transistor or MOS transistors having a threshold voltage smaller than that of MOS transistors constructing another complementary type logic circuit. A current of the bipolar transistor flows at an input voltage lower than that of the related art BIMOS logic gate and the current can be cut off by an input voltage which is equal to that of the ordinary complementary type logic circuit. Thus, the gate operates at a low electric power and can operate at a high speed at a low power source voltage.

9 Claims, 4 Drawing Sheets

FAST TRAILING BIMOS LOGIC GATE

BACKGROUND OF THE INVENTION

The present invention relates to a BIMOS logic gate.

In recent years, considerable attention has been paid to a BIMOS logic gate using MOS and bipolar transistors. FIG. 1 shows a BIMOS logic gate as a related art. An input terminal 1 is connected to gates of PMOS transistors 2a and 2b and NMOS transistors 3a and 3b which construct a complementary type logic circuit. An output of the complementary type logic circuit is connected to a base of a first bipolar transistor 4 whose emitter is connected to an output terminal 5 and which functions as a buffer when the output rises. When the output trails, a second bipolar transistor 6 whose emitter and collector is connected to the preground and output terminal 5 respectively discharges the stored charges at the output terminal 5. NMOS transistors 7a and 7b are provided to control the conduction between base and collector of the second bipolar transistor 6 by the logic state of the input terminal 1. Transistors 7a and 7b are connected between the base and collector of the transistor 6. A current which flows through the NMOS transistors 7a and 7b is injected to the base of the second bipolar transistor and is amplified to a large collector current due to the current amplifying function of the bipolar transistor, thereby realizing the steep trailing of the output voltage. An NMOS transistor 8 is provided to cut off the second bipolar transistor 6 when the output level of the output terminal 5 is set to "1". Reference numeral 9 denotes a power source. In the above construction, to construct the complementary type logic circuit, the NMOS transistors 3a and 3b are of the enhancement type and the NMOS transistors 7a and 7b are also of the enhancement type in accordance with those transistors.

As compared with the ordinary complementary type logic circuit using only MOS transistors, the foregoing type of circuit has features such that the dependence of the logic delay time on the load capacitor is small and the speed is high due to the buffer operation of the bipolar transistor.

However, as shown in H MOMOSE, "0.5 MICRON MICMOS TECHNOLOGY", IEDM (International Electron Devices Meeting) 87, the related art circuit as shown in FIG. 1 has a problem such that when the power source voltage drops, the delay time rapidly becomes large. Such a problem is an extremely significant subject when future fine MOS transistors are used.

SUMMARY OF THE INVENTION

It is an object of the present invention to provide a BIMOS logic gate which operates at a higher speed and at a lower voltage.

To accomplish the above object, a BIMOS logic gate of the invention comprises: a bipolar transistor whose emitter is connected to the ground and which amplifies a current flowing from MOS transistors to a base and executes a trailing operation of a logic output voltage; and depletion type MOS transistors whose sources are connected to a base of the bipolar transistor or enhancement type MOS transistors having a threshold voltage which is smaller than that of the MOS transistors constructing another complementary type logic circuit.

With the above construction, according to the invention, when assuming that the threshold voltage of the MOS transistor is $V_t$ and a base-emitter forward biasing voltage of the bipolar transistor is $V_j$, a threshold voltage of the circuit system is set to $V_t + V_j$. Therefore, even if the threshold voltage $V_t$ of the MOS transistor is set to a slightly positive or negative voltage, when the input voltage is at a low voltage level, the circuit system can be completely cut off. Therefore, since a through current which stationarily flows does not exist similarly to the case of a related art CMOS logic circuit, the invention can operate at a low electric power. On the other hand, when the input voltage rises, a current flows from a voltage lower than the threshold voltage of the related art circuit. Further, in the case of the same gate voltage, since a larger drain current flows, a BIMOS logic gate which operates at a high speed and at a low voltage can be realized.

DESCRIPTION OF THE PREFERRED EMBODIMENTS

A practical embodiment of the present invention will be described hereinbelow with reference to the drawings.

Figure 1:
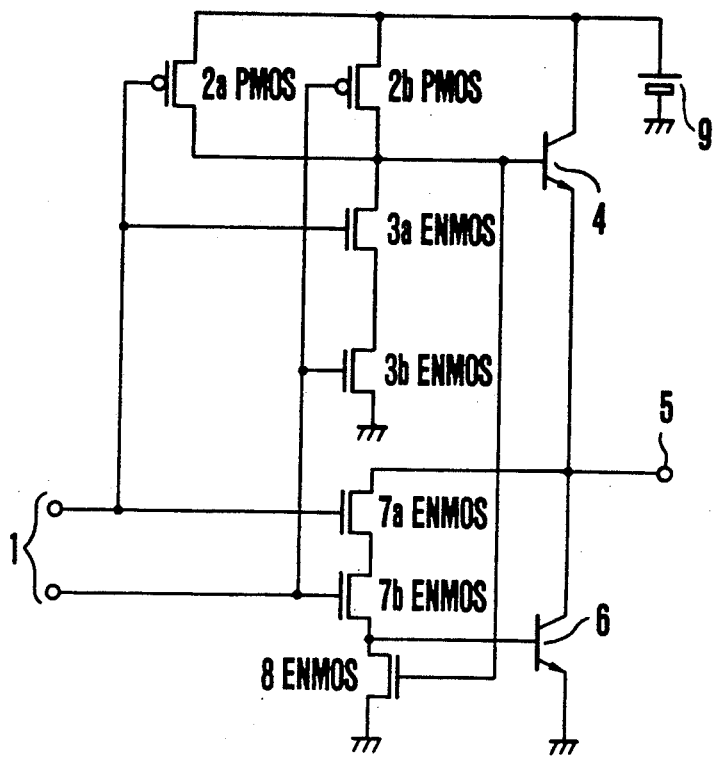
FIG. 1 is a circuit diagram of a related art BIMOS logic gate.
Figure 2:
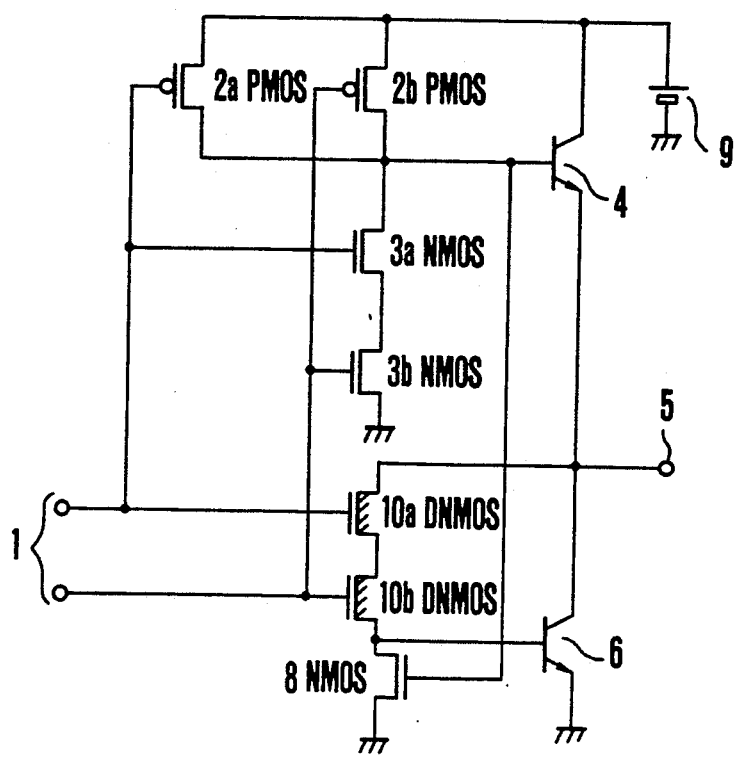
FIG. 2 is a circuit diagram of a BIMOS logic gate according to an embodiment of the present invention.

FIG. 2 shows a logic gate in an embodiment of the invention. In the embodiment, the enhancement type NMOS transistors 7a and 7b inserted between the base and collector of the second bipolar transistor 6 in the circuit shown in FIG. 1 are replaced by depletion type NMOS transistors 10a and 10b.

Prior to describing the operation of FIG. 2, the effect of the depletion type MOS transistors whose sources are connected to the base of the bipolar transistor or the effect of the MOS transistors having a threshold voltage smaller than that of the MOS transistors constructing another CMOS logic gate will now be simply explained.

Figure 3:
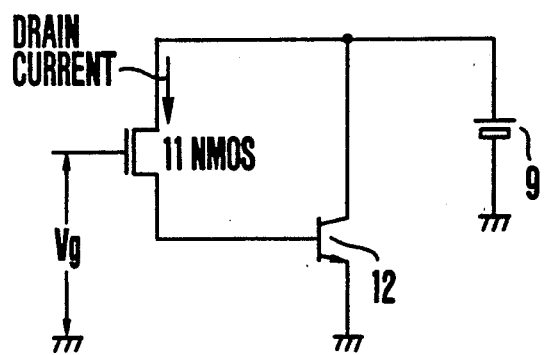
FIG. 3 is a circuit diagram for explaining the operation of the invention.

FIG. 3 is a circuit diagram showing the circuit system. An emitter of a bipolar transistor 12 is connected to the ground and a base is connected to a source of an MOS transistor 11. When a voltage which is applied to a gate of the MOS transistor 11 is set to $V_g$ by using a grounding point as a reference, a drain current $I_{ds}$ flowing through the MOS transistor 11 is expressed by the following equation.

$$I_{ds} = \frac{\beta}{2}(V_g - V_t - V_j)^2$$

$\beta$: Mutual Conductance
$V_t$: Threshold voltage of the MOS transistor 11
$V_j$: Diode voltage in the forward biasing of the bipolar transistor 12

Figure 4:
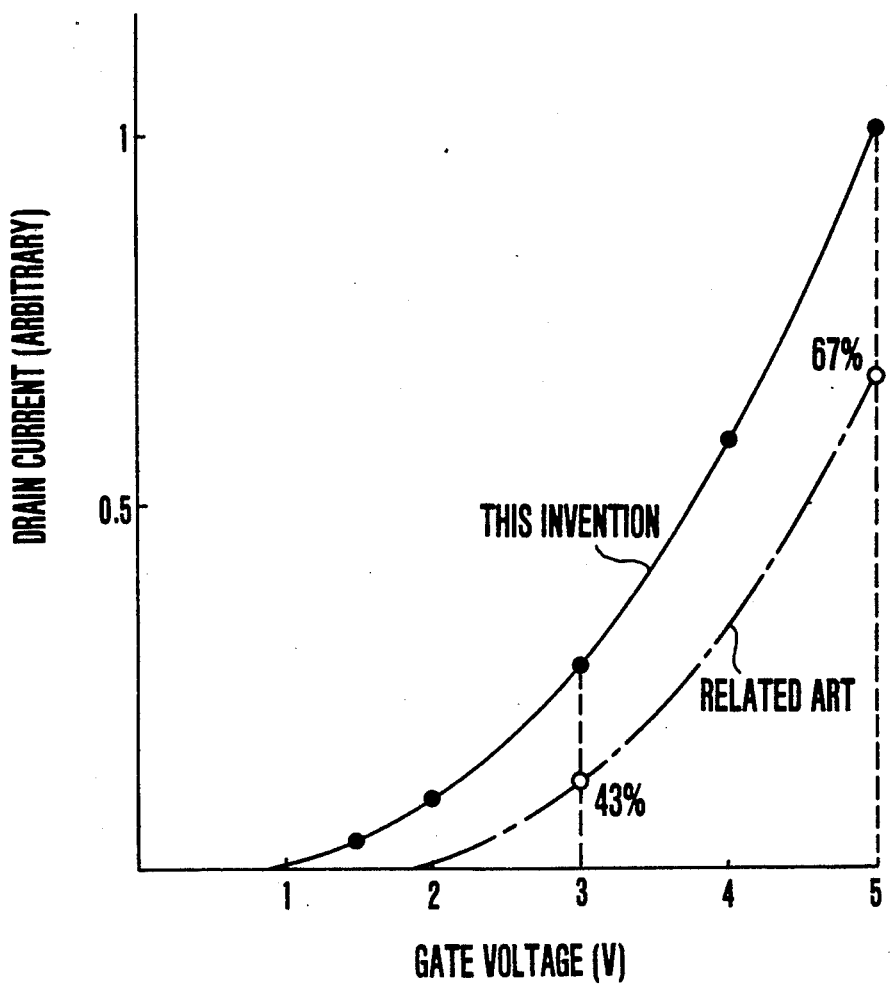
FIGS. 4 and 5 are characteristic diagrams for explaining the operation of the invention.

FIG. 4 is a graph showing the above equation. In the graph, an axis of abscissa indicates the gate voltage $V_g$ and an axis of ordinate represents the drain current $I_{ds}$.

In the invention, in the above equation, it is assumed that $V_t=0$ V and $V_j=0.75$ V. In the related art circuit, since the enhancement type MOS transistor is used, $V_t=0.75$ V and $V_j=0.75$ V in the above equation, so that the drain current $I_{ds}$ is smaller than that in the case of the invention. For instance, when the gate voltage $V_g$ is 5 V, the drain current $I_{ds}$ has a value of 67% of that in the invention. When the gate voltage $V_g$ is 3 V, the drain current has a value of 43% of the invention. In other words, this means that the invention has a driving capability higher than that of the related art circuit. For instance, when the gate voltage $V_g=3$ V, the invention has the driving capability which is about twice as that of the related art circuit. Further, in the related art circuit, the drain current flows when the gate voltage is about 2 V or higher. However, according to the invention, a drain current flows when the gate voltage is about 1 V or higher. On the other hand, when the gate voltage $V_g=0.75$ V or lower, no drain current flows and a through current is not generated. It should be noted that the above points are extremely significant in the invention. Because of the above reasons, the gate of the invention operates at a low electric power consumption in a manner similar to the related art circuit, and further, a logic gate of a higher speed than the related art circuit can be realized.

Therefore, in the first embodiment of the invention of FIG. 2, the gate operates similarly to the related art circuit when the logic output level changes from "L" to "H". However, when the logic output level changes from "H" to "L", a larger current of the depletion type MOS transistors 10a and 10b flows at an earlier timing than the related art circuit and rives the base of the second bipolar transistor 6. Consequently, the BIMOS logic gate which operates at a higher speed than the related art circuit can be realized.

Figure 5:
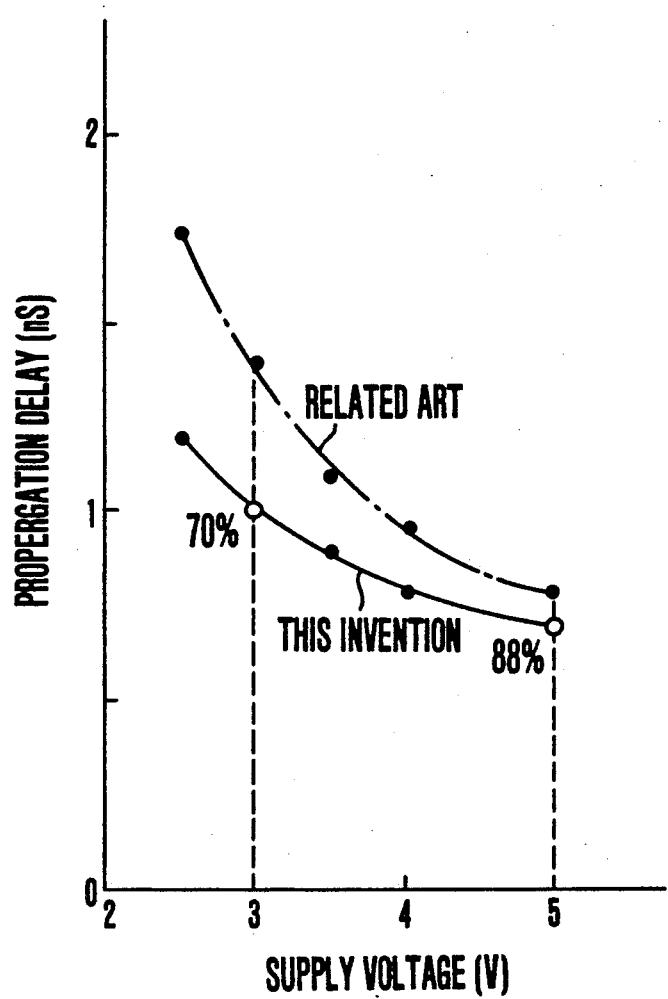

FIG. 5 shows the relation between the signal delay times in the invention and the related art circuit to the power source voltage when the load capacitance is set to 1 pF. When the power source voltage is 5 V, the signal delay time of the invention is about 88% of that of the related art circuit. However, when the power source voltage is 3 V, the signal delay time is about 70%. The gate of the invention operates at a high speed in the whole range of the power source voltage. Particularly, in the low voltage range, the gate of the invention can operate at a very higher speed than the related art circuit.

In the above description, the depletion type transistors having the threshold voltage of 0 V have been used as the transistors 10a and 10b. However, the threshold voltage is not necessarily set to 0 V. The above-mentioned effects are also obtained if the depletion type NMOS transistor whose threshold voltage is negative, or the NMOS transistor whose threshold voltage is lower than that of the NMOS transistor forming the complementary type logic circuit in the BIMOS logic gate is used.

Figure 6:
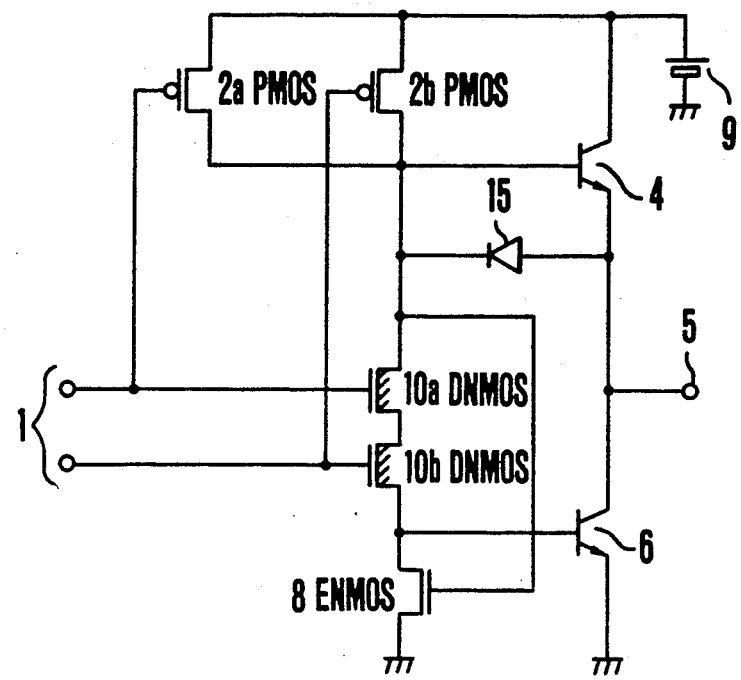
FIG. 6 is a circuit diagram of a BIMOS logic gate according to the second embodiment of the invention.

FIG. 6 shows a BIMOS logic gate as the second embodiment of the invention. In FIG. 6, the transistors 3a and 3b of the first embodiment of the invention shown in FIG. 2 are omitted and the same function as the transistors 3a and 3b is substituted by the transistors 10a and 10b. A diode 15 is provided to prevent the current flowing through the transistors 10a and 10b from being extinguished before the voltage at the output terminal 5 completely drops when the output trails. In this embodiment as well, the enhancement type transistors 10a and 10b in the related art circuit are also replaced by the depletion type transistors.

In the ordinary CMOS logic gate, no depletion type transistor is used. This is because there is a drawback such that when the depletion type transistors are used, since the threshold voltage is set to a negative value, even when the logic input voltage is set to a low enough voltage level, a static through current flows and electric power consumption increases. On the other hand, according to the embodiment, even if the enhancement type NMOS transistors 10a and 10b constructing the CMOS logic gate are replaced by the depletion type NMOS transistors, the threshold voltage of the circuit system, when it is seen from the input side, can be set to a slightly positive voltage due to the existence of the voltage $V_j$ in the forward direction between the base and emitter of the second bipolar transistor 6. Therefore, when the input voltage is set to a sufficiently low voltage level, only a very small static through current flows and no increase in electric power consumption is caused. Therefore, even in this embodiment, because of the reasons mentioned in the first embodiment, the gate operates at a low electric power and the base of the bipolar transistor can be driven by a current larger than that of the related art BIMOS logic gate, so that a BIMOS logic gate which operates at a high speed can be realized.

Figure 7:
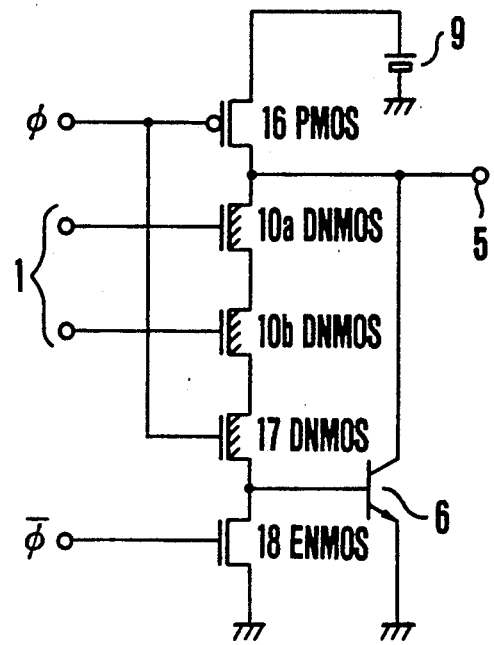
FIG. 7 is a circuit diagram of a BIMOS logic gate according to the third embodiment of the invention.

FIG. 7 is a diagram showing a BIMOS logic gate as the third embodiment of the invention. In the gate, the related art dynamic type logic gate is replaced by the BIMOS logic gate. When a clock $\emptyset$ is set to the "L" level, a PMOS transistor means 16 is turned on and an NMOS transistor 17 is turned off. Since the inverted signal $\emptyset$ of the clock is set to the "H" level, an NMOS transistor 18 is turned on, the second bipolar transistor 6 is turned off, and the output terminal 5 is set to the "H" level irrespective of the logic level of the input. When the clock $\emptyset$ is set to "H", the PMOS transistor 16 is turned off and the NMOS transistor 17 is turned on. Since the inverted signal of the clock is now set to "L", the NMOS transistor 18 is turned off. In such a state, since the NMOS transistors 10a and 10b are made conductive in accordance with the logic level of the input, a current flowing through the transistors 10a and 10b flows to the base of the second bipolar transistor 6. The collector current amplified by the current amplifying function of the bipolar transistor 6 rapidly pulls out the charges of the load capacitor, so that a logic output is generated at a high speed. Even in such a dynamic circuit, if the transistors 10a, 10b, and 17 are constructed by the depletion type transistors or by the MOS transistors having a threshold voltage smaller than the MOS transistors constructing another CMOS logic gate, a higher speed logic gate can be realized.

As mentioned above, since the BIMOS logic gate is constructed by the depletion type MOS transistors whose sources are connected to the base of the bipolar transistor or by the enhancement type MOS transistors having a threshold voltage smaller than the MOS transistor constructing another complementary type logic circuit, when the input voltage is set to a voltage level lower than the voltage between the base and emitter of the bipolar transistor, the circuit system can be perfectly cut off. On the other hand, when the input voltage rises, a current flows from a voltage lower than the threshold voltage of the related art circuit. In the case of the same gate voltage, a larger current than that in the related art BIMOS logic gate can be allowed to flow. Therefore, the logic gate which operates at a higher speed can be realized. Particularly, when the power source voltage drops, the operating speed of the gate of the invention is very much higher than that of the related art BIMOS logic gate. Therefore, the BIMOS logic gate of the invention is effective to realize the high speed and low voltage operation of the logic gate. Particularly, when fine MOS transistors whose channel lengths are 0.5 μm or less are used, since the power source voltage certainly drops, the invention is extremely effective to realize the high performance of a future VLSI circuit.

We claim:

1. A BIMOS logic gate comprising:
   a P type MOS transistor;
   an N type MOS transistor having a first threshold voltage, said P type MOS transistor and said N type MOS transistor providing a complementary type logic circuit;
   a first bipolar transistor having a base connected to an output terminal of said complementary type logic circuit;
   a second bipolar transistor having an emitter connected to ground and a collector connected to an emitter of the first bipolar transistor; and
   an N type MOS transistor having a second threshold voltage which is connected between said collector and a base of the second bipolar transistor,
   wherein said second threshold voltage is lower than said first threshold voltage.

2. A BIMOS logic gate comprising:
   a P type MOS transistor and an enhancement N type MOS transistor which form a complementary type logic circuit;
   a first bipolar transistor having a base connected to an output terminal of said complementary type logic circuit;
   a second bipolar transistor having an emitter connected to ground and a collector connected to an emitter of the first bipolar transistor; and
   a depletion N type MOS transistor connected between the collector and a base of the second bipolar transistor.

3. A BIMOS logic gate comprising:
   a P type MOS transistor and a depletion N type MOS transistor which form a complementary type logic circuit;
   a first bipolar transistor having a base connected to an output terminal of the complementary type logic circuit; and
   a second bipolar transistor having an emitter connected to ground and a collector connected to an emitter of the first bipolar transistor and a base connected to a drain of said depletion N type MOS transistor.

4. A BIMOS logic gate comprising:
   an output terminal;
   a P type MOS transistor means for precharging said output terminal synchronously with a clock signal;
   a bipolar transistor having an emitter connected to ground and a collector connected to said output terminal; and
   a depletion N type MOS transistor interconnected between said collector and a base of said bipolar transistor to control conduction between said output terminal and said base of the bipolar transistor in accordance with a logic state of an input terminal of said depletion N type MOS transistor.

5. A BIMOS logic gate, comprising:
   an output terminal;
   a bipolar transistor having a collector connected to said output terminal and an emitter connected to ground;
   a depletion type MOS transistor having a source connected to a base of said bipolar transistor and a drain connected to said collector of said bipolar transistor;
   wherein an input voltage is applied between a gate of said depletion type MOS transistor and an emitter of said bipolar transistor to control a collector current of said bipolar transistor so as to increase the collector current for executing fast trailing operation of the output terminal voltage as a function of increasing input voltage.

6. A BIMOS logic gate, comprising:
   an output terminal;
   a P type MOS transistor having a gate and a drain;
   a first N type MOS transistor having a first threshold voltage and a source and a gate respectively connected to said drain and said gate of said P type MOS transistor, said first N type MOS transistor and said P type MOS transistor forming a complementary logic gate;
   a firs bipolar transistor having a base connected to an output node of said complementary logic gate and an emitter connected to said output terminal;
   a second bipolar transistor having a collector connected to both said output terminal of the BIMOS gate and said emitter of said first bipolar transistor and an emitter connected to ground;
   a second N type MOS transistor having a second threshold voltage and having a source connected to said base of said second bipolar transistor, said first and second N type MOS transistors having their drains connected together;
   wherein said second threshold voltage is lower than said first threshold voltage, and
   an input voltage is applied (i) between a gate of said second N type MOS transistor and an emitter of said second bipolar transistor, and (ii) to an input node of said complementary logic gate to control a collector current of said second bipolar transistor so as to increase the collector current for executing fast trailing operation of the output terminal voltage as a function of increasing input voltage.

7. A BIMOS logic gate comprising:
   an output terminal;
   a P type MOS transistor having a gate and a drain;
   an enhancement N type MOS transistor having a source and drain respectively connected to said drain and said gate of said P type MOS transistor, said enhancement N type MOS transistor and said P type MOS transistor forming a complementary logic gate;
   a first bipolar transistor having a base connected to an output node of said complementary logic gate and an emitter connected to said output terminal;
   a second bipolar transistor having a collector connected to both said output terminal of the BIMOS gate and said emitter of said first bipolar transistor and an emitter connected to ground;
   a depletion N type MOS transistor having a source connected to a base of said second bipolar transistor;
   wherein an input voltage is applied (i) between a gate of said depletion N type MOS transistor and an emitter of said second bipolar transistor, and (ii) to an input node of said complementary logic gate to control a collector current of said second bipolar transistor so as to increase the collector current for executing fast trailing operation of the output terminal voltage as a function of increasing input voltage.

8. A BIMOS logic gate comprising:
an output terminal;
a P type MOS transistor having a gate and a drain;
a depletion N type MOS transistor having a source and a gate respectively connected to said drain and said gate of said P type MOS transistor, said depletion N type MOS transistor and said P type MOS transistor forming a complementary logic gate;
a first bipolar transistor having a base connected to an output node of said complementary logic gate and an emitter connected to said output terminal;
a second bipolar transistor having a collector connected to both said output terminal of the BIMOS gate and said emitter of said first bipolar transistor, a base connected to said source of said depletion N type transistor and emitter connected to ground;
wherein an input voltage is applied between a gate of said depletion N type MOS transistor and an emitter of said second bipolar transistor to control a collector current of said second bipolar transistor so as to increase the collector current for executing fast trailing operation of the output terminal voltage as a function of increasing input voltage.

9. A BIMOS logic gate comprising:
an output terminal;
a P type MOS transistor means for precharging said output terminal synchronously with a clock signal;
a bipolar transistor having a collector connected to said output terminal of the BIMOS gate and an emitter connected to ground;
a depletion N type MOS transistor having a drain and source connected to said output terminal and a base of said bipolar transistor for controlling conduction between said output terminal and said base of said bipolar transistor in accordance with a logic state of an input terminal of said depletion N type MOS transistor;
wherein an input voltage is applied between a gate of said depletion N type MOS transistor and an emitter of said bipolar transistor to control a collector current of said bipolar transistor so as to increase the collector current for executing fast trailing operation of the output terminal voltage as a function of increasing input voltage.

* * * * *